United States Patent
Kannan et al.

(10) Patent No.: US 10,069,490 B2
(45) Date of Patent: Sep. 4, 2018

(54) METHOD, APPARATUS AND SYSTEM FOR VOLTAGE COMPENSATION IN A SEMICONDUCTOR WAFER

(71) Applicant: GLOBALFOUNDRIES INC., Grand Cayman (KY)

(72) Inventors: Sukeshwar Kannan, Malta, NY (US); Luke England, Saratoga Springs, NY (US); Mehdi Sadi, Gainesville, FL (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/013,956

(22) Filed: Feb. 2, 2016

(65) Prior Publication Data

US 2017/0222634 A1 Aug. 3, 2017

(51) Int. Cl.
| | |
|---|---|
| H03K 3/017 | (2006.01) |
| H03K 5/003 | (2006.01) |
| H03K 5/156 | (2006.01) |
| G05F 1/10 | (2006.01) |
| G06F 1/26 | (2006.01) |
| H02M 3/158 | (2006.01) |
| H02M 3/156 | (2006.01) |

(52) U.S. Cl.
CPC ............. *H03K 5/003* (2013.01); *G05F 1/10* (2013.01); *G06F 1/26* (2013.01); *H02M 3/158* (2013.01); *H03K 5/1565* (2013.01); *H02M 2003/1566* (2013.01)

(58) Field of Classification Search
CPC .................... H03K 5/003; H03K 5/1565
USPC ....... 327/175, 530, 535, 538, 540–546, 170, 327/172–174, 333; 323/285, 273, 283
See application file for complete search history.

(56) References Cited

U.S. PATENT DOCUMENTS

| | | | |
|---|---|---|---|
| 7,548,047 B1 * | 6/2009 | Dasgupta ............. | H02M 3/156 323/283 |
| 2005/0046467 A1 * | 3/2005 | Kase ....................... | G05F 1/56 327/541 |
| 2006/0170402 A1 * | 8/2006 | Banerjee .................. | G05F 1/56 323/273 |
| 2007/0001739 A1 * | 1/2007 | Boerstler ......... | H03K 19/00323 327/333 |
| 2011/0121811 A1 * | 5/2011 | Dennard ............... | H01L 23/642 323/318 |

* cited by examiner

*Primary Examiner* — Thomas Skibinski
(74) *Attorney, Agent, or Firm* — Williams Morgan, P.C.

(57) ABSTRACT

At least one method, apparatus and system disclosed involves performing a dynamic voltage compensation in an integrated circuit. A first voltage on a first portion of an integrated circuit is received. A second voltage on a second portion of the integrated circuit is monitored. A determination is made as to whether the second voltage fell below the first voltage by a predetermined margin. A feedback adjustment of of the second voltage is performed in response to a determination that the second voltage fell below the first voltage by the predetermined margin; the feedback adjustment comprises performing a step up of the second voltage.

18 Claims, 8 Drawing Sheets

METHOD, APPARATUS AND SYSTEM FOR VOLTAGE COMPENSATION IN A SEMICONDUCTOR WAFER

BACKGROUND OF THE INVENTION

Field of the Invention

Generally, the present disclosure relates to the manufacture of sophisticated semiconductor devices, and, more specifically, to circuit for performing voltage compensation on a die of a semiconductor wafer.

Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot, using semiconductor-manufacturing tools, such as exposure tool or a stepper. As an example, an etch process may be performed on the semiconductor wafers to shape objects on the semiconductor wafer, such as polysilicon lines, each of which may function as a gate electrode for a transistor. As another example, a plurality of metal lines, e.g., aluminum or copper, may be formed that serve as conductive lines that connect one conductive region on the semiconductor wafer to another.

In this manner, integrated circuit chips may be fabricated. In some cases, integrated circuit or chips may comprise various devices that work together based upon a hard-coded program. For example, application-specific integrated circuit (ASIC) chips may use a hard-coded program for various operations, e.g., boot up and configuration processes. The program code, in the form of binary data, is hard-coded into the integrated circuit chips.

When designing a layout of various devices with an integrated circuits (e.g., CMOS logic architecture), designers often select pre-designed functional cells comprising various features (e.g., diffusion regions, transistors, metal lines, vias, etc.) and place them strategically to provide an active area of an integrated circuit. The pre-designed functional cells are often used to design transistors, such as metal oxide field effect transistors (MOSFETs or FETs).

A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

There are essentially two types of FETs: planar FETs and so-called 3D devices, such as a finFET device, which is a 3-dimensional structure. More specifically, in a finFET, a generally vertically positioned, fin-shaped active area is formed and a gate electrode encloses both of the sides and the upper surface of the fin-shaped active area to form a trigate structure so as to use a channel having a 3-dimensional structure instead of a planar structure. In some cases, an insulating cap layer, e.g., silicon nitride, is positioned at the top of the fin and the finFET device only has a dual-gate structure.

There are challenges when forming the so-called 3D, such as finFETs, TSVs, etc., as well as for 2D devices. For example, when a number of die formation are processed on a semiconductor wafer, a voltage drop from one layer of the integrated circuit to another layer can cause performance problems. For example, a voltage applied onto the pin of an integrated circuit may experience a current-resistance (IR) voltage drop as compared to the voltage at a formation immediately adjacent to the voltage source, to another formation on another layer.

Designers have sought to alleviate this problem by providing a voltage regulator circuit to maintain the desired voltage level at a particular formation on layer of the integrated circuit. FIG. 1 illustrates a state of the art integrated circuit 100 comprising a plurality of features. A first die 110 may comprise an integrated circuit 120. The integrated circuit 120 may comprise a $1^{st}$ feature 132, a $2^{nd}$ feature 134, and a $3^{rd}$ feature 136 through an $N^{th}$ feature 138 (collectively "130"). In some cases, these features 130 may be formed on separate process layers that are formed on a base substrate. The integrated circuit 120 may be a 2-D device, or a 3-D device that comprises additional layers surrounding the $N^{th}$ feature 138. The $N^{th}$ feature 138 may be connected to the $2^{nd}$ feature 136.

The integrated circuit 120 may be packaged, e.g., in a ceramic-based material, and attached to a plurality of pins. Two of the pins may be respectively designated for a voltage signal and ground. A voltage supply 140 may provide the voltage signal to a voltage pin 150. This pin may be of various types, such as surface mount pins, e.g., ball grid array pins, or pins of other shapes.

In many cases, the voltage level at the $1^{st}$ feature 132, which is near the voltage supply 140, as well as the power pin 150, will have substantially the same voltage of the voltage supply 140. In many cases, a large equivalent resistance is present in the integrated circuit 120 due to various back-end-of-line (BOEL) stacks formed in the integrated circuit 120. Due to the IR drop in the various layers in the integrated circuit 120, the voltage level at the $2^{nd}$ feature 135 is substantially lower. Thus the $N^{th}$ feature 138 may experience a significant voltage drop, compared to the voltage level at the power pin 150. The drop in voltage may be more pronounced when the top layer where $2^{nd}$ feature 136 is formed experiences a larger load, e.g., for intense CPU computation applications, such as graphic applications, gaming applications, etc.

FIG. 2 illustrates a graphical depiction of a voltage curve that shows a voltage drop resulting from an increased load on a feature of an integrated circuit. During normal loading, the voltage level at a particular location of the integrated circuit 120 may be at a nominal voltage level ($V_{nom}$). However, the $N^{th}$ feature 138 may experience a larger loading, which would cause the voltage at the particular location of the integrated circuit 120 to degrade due to an IR drop (i.e., $V_{deg}$). This drop, which may be by the amount $V_{drop}$, could cause operation errors and failures.

In order to address these problems, designers have resorted to implementing voltage regulation circuits to maintain desired voltages at specific portions of an integrated circuit. FIG. 3 illustrates a typical voltage regulation unit coupled to an integrated circuit. FIG. 2 comprises the $1^{st}$ die 110 of FIG. 1, as well as a $2^{nd}$ die that includes a voltage regulation unit 320. In order to maintain a desired voltage level at the $N^{th}$ feature, a voltage regulation unit 320 may be used. The voltage regulation unit 320 may comprise a voltage regulator 302, various analog circuitry 324, a phase lock loop (PLL) 326 to maintain phase with the components of the $1^{st}$ die, and a pulse width modulator 328 to control the voltage provided by the voltage regulation unit 320.

There are several problems associated with this state of the art solution. For example, the components of the voltage regulation unit 320 cause an appreciable amount of power loss during its operation. The voltage regulation unit 320 contains various analog blocks that are slower and use appreciable amount of power. The PLL 326 and the pulse width modulator 328 also use a significant amount of power for operations. Further, the voltage regulation unit 320 is not capable of detecting and compensating for voltage drops based on any detection. Thus, the voltage regulation unit 320 is not able to react to time periods during which heavy loads are experienced by the integrated circuit 120.

The voltage regulation unit 320 application of the state of the art is generally implemented in a separate die. This causes increased usage of space, as larger chip packages are required to form the additional die that hosts the voltage regulation unit 320.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for performing a dynamic voltage compensation in an integrated circuit. A first voltage on a first portion of an integrated circuit is received. A second voltage on a second portion of the integrated circuit is monitored. A determination is made as to whether the second voltage fell below the first voltage by a predetermined margin. A feedback adjustment of the second voltage is performed in response to a determination that the second voltage fell below the first voltage by the predetermined margin; the feedback adjustment comprises performing a step up of the second voltage.

BRIEF DESCRIPTION OF THE DRAWINGS

The disclosure may be understood by reference to the following description taken in conjunction with the accompanying drawings, in which like reference numerals identify like elements, and in which.

Figure 1:
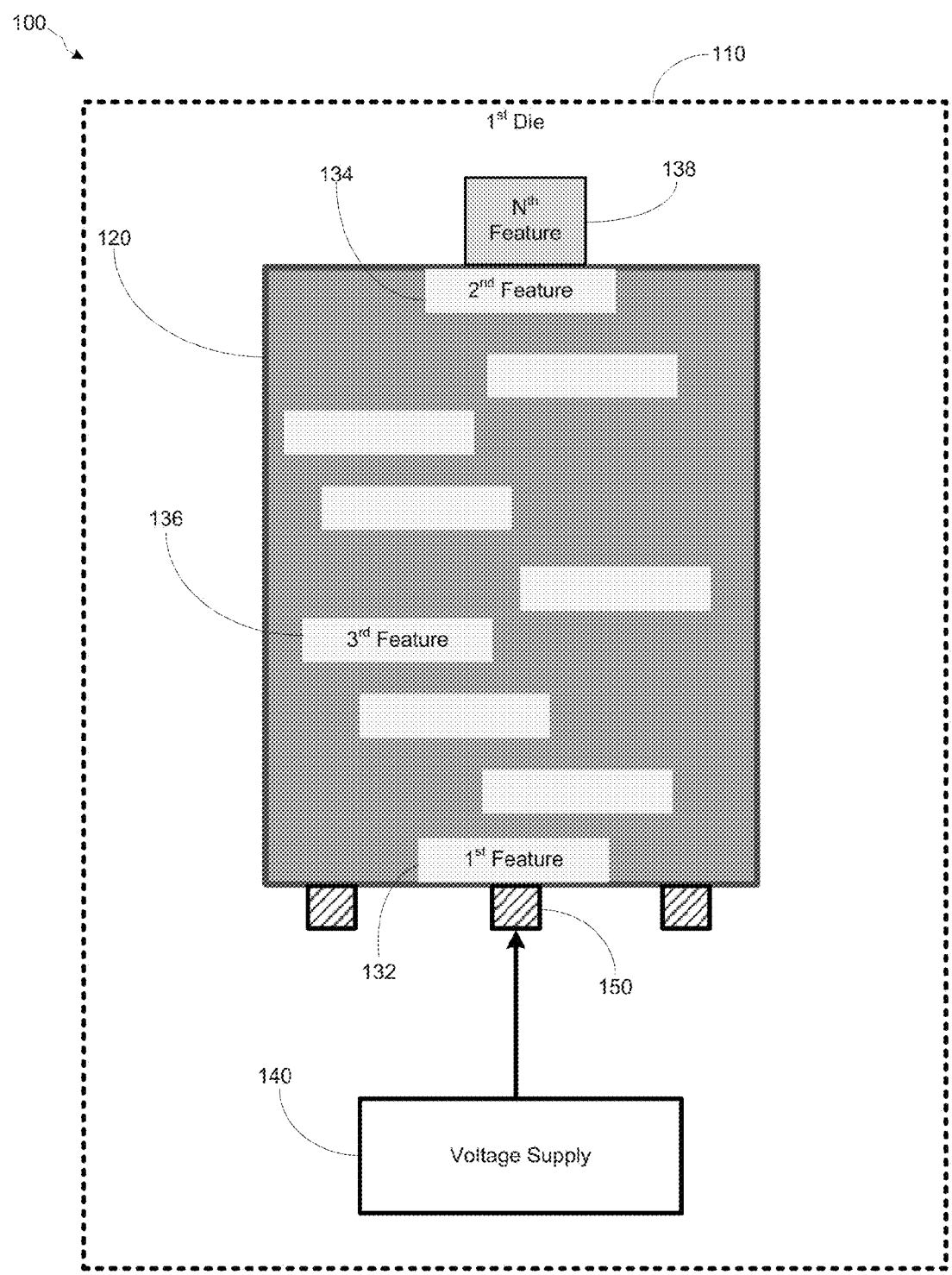
FIG. 1 illustrates a state of the art integrated circuit 100 comprising a plurality of features.
Figure 2:
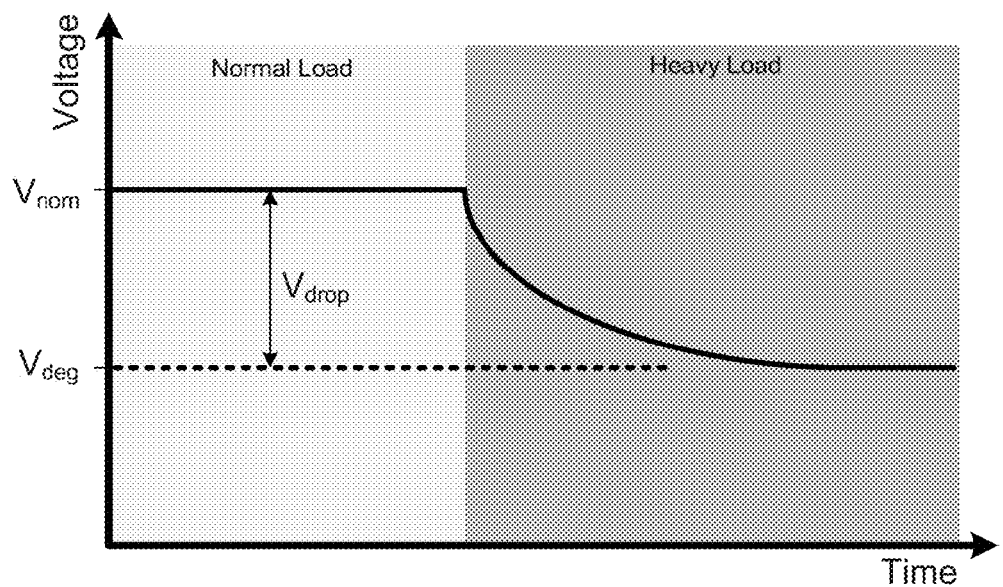
FIG. 2 illustrates a graphical depiction of a voltage curve that show a voltage drop resulting from an increased load on a feature of an integrated circuit.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for providing a voltage compensation circuit to provide a dynamic adjustment of voltage in an integrated circuit. The voltage compensation circuit of embodiments herein is capable of detecting an IR voltage drop and compensating for the voltage drop. For example, an IR drop sensor may be used to sense an IR voltage drop. This may be used in conjunction with a buck converter to compensate for the IR voltage drop. The energy for performing the compensation may be provided by a secondary voltage supply operatively coupled to the buck converter. Embodiments herein also provide for utilizing a digital duty cycle adjustment circuit to adjust the switching frequency of the buck converter based on the output of a comparator.

Embodiments herein provide for dynamically boosting the supply voltage on one portion of an integrated circuit in response to sensing an IR voltage drop. This compensation may be performed, for example, on a top die portion of a 2D or a 3D stack. Further, embodiments herein provide for dynamically compensating for an IR voltage drop caused by increased loading cycles that increases the load experienced by the top die portion of the 2D or 3D stack. In one embodiment, the term "dynamically boosting a voltage signal" comprises at least one of boosting the voltage signal in a real time or a near real time basis.

Figure 4:
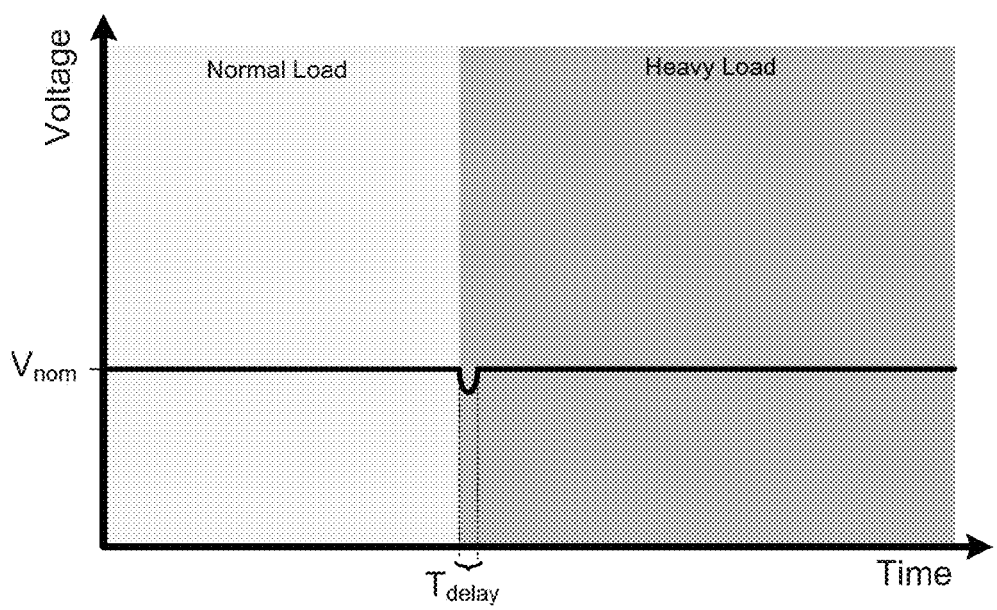
FIG. 4 illustrates a graphical depiction of a voltage curve that shows a recovery of a voltage drop that results from an increased load on a feature of an integrated circuit, in accordance with embodiments herein.
Figure 3:
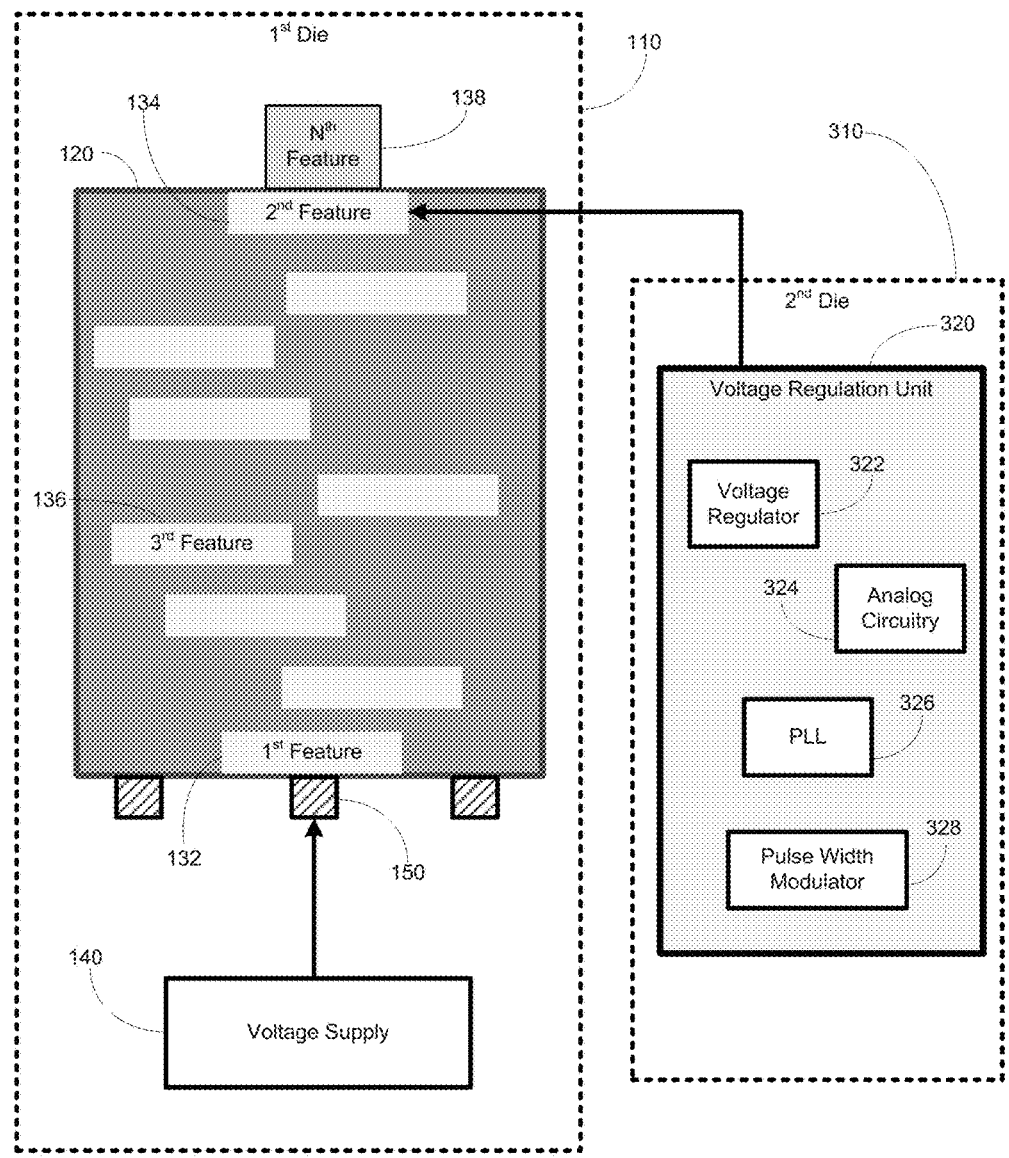
FIG. 3 illustrates a typical voltage regulation unit coupled to an integrated circuit.

FIG. 4 illustrates a graphical depiction of a voltage curve that shows a recovery of a voltage drop that results from an increased load on a feature of an integrated circuit, in accordance with embodiments herein. During normal loading, the voltage level at a particular location of the integrated circuit 120 may be at a nominal voltage level ($V_{nom}$). However, a circuit feature may experience a larger loading, which would cause the voltage at the particular location of the integrated circuit 120 to experience an IR drop. However, using the voltage compensation circuit of embodiments herein, a dynamic recovery of the voltage $V_{nom}$ may be automatically performed. The delay ($T_{delay}$) in recovering the voltage ($V_{nom}$) may depend on the feedback loop response time of the voltage compensation network.

Figure 5:
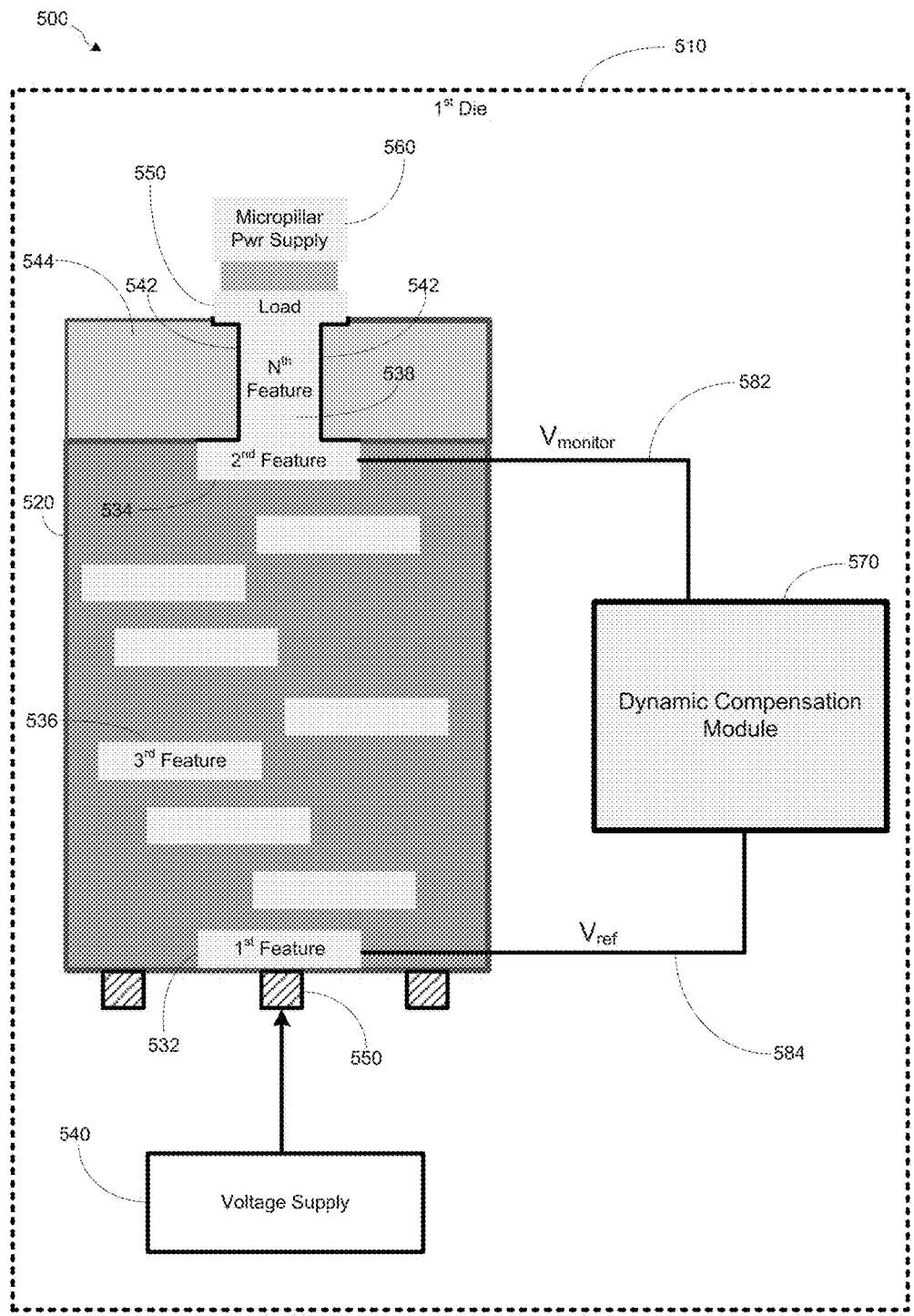
FIG. 5 illustrates a stylized depiction of a device having an integrated circuit coupled to a dynamic compensation module, in accordance with embodiments herein.

Turning now to FIG. 5, a stylized depiction of a device having an integrated circuit coupled to a dynamic compensation module, in accordance with embodiments herein, is illustrated. A first die 510 may comprise an integrated circuit 520 and a dynamic compensation circuit. The integrated circuit 520 is depicted as a 3D device, however, the concepts described herein also apply to 2D devices.

The integrated circuit 520 may comprise a first portion, which may be a stacked die network that comprises a $1^{st}$ feature 532, a $2^{nd}$ feature 534, a $3^{rd}$ feature 536 through an $N^{th}$ feature 538 (collectively "530"). In some cases, these features 530 may be formed on separate BEOL layers that are formed on a base substrate. The $N^{th}$ feature 538 may be connected to the $2^{nd}$ feature 536. In one embodiment, the $N^{th}$ feature 538 may be part of a 3D feature that is encompassed in a second portion of the integrated circuit 520 that includes silicon layers 542 (e.g., silicon dioxide layer) and 544 (e.g., bulk silicon layer). In one example, the $N^{th}$ feature 538 is a through-silicon via (TSV). The $N^{th}$ feature 538 may be coupled to a load 550, which may acts as a voltage supply to the top-die/next die in 3D stack, e.g., a micropillar supply voltage 560. As noted above, the concepts herein may be applied to a 2D circuit wherein the $2^{nd}$ feature 534 is coupled to an $N^{th}$ feature 538 that is, for example, a transistor.

The integrated circuit 520 may be packaged, e.g., in a ceramic-based material, and attached to a plurality of pins. At least two of the pins may be respectively designated for the voltage signal and ground. A voltage supply 540 may provide the voltage signal to a power pin 550. The pins may be of various types, such as through-hole pins or surface mount pins, e.g., ball grid array pins, or pins of other shapes.

In many cases, the voltage level at the $1^{st}$ feature 532, which is near the voltage supply 540, as well as on the power pin 550, is substantially the same voltage as of the voltage supply 540. However, due to the IR drop in the various layers in the integrated circuit 520, the voltage level at the $2^{nd}$ feature 534 may be substantially lower. Further, loading experienced by the $N^{th}$ feature 538 may cause a drop in the voltage at the $N^{th}$ feature 538. Thus, the $N^{th}$ feature 538 may experience a significant voltage drop, compared to the voltage level at the power pin 550. The drop in voltage may be more pronounced with the top layer where a load 550 experienced by the $N^{th}$ feature 538 is significant, e.g., with regard to intense CPU computation applications, such as graphic applications, gaming applications, etc. In one embodiment, the $2^{nd}$ feature 534 that is coupled to the $N^{th}$ feature 538 is at a first metal layer (M1) or first via layer (V0) of a BEOL stack. In one embodiment the $1^{st}$ feature 332 may be an upper metal layer, e.g., a G2 layer.

The dynamic compensation module 570 is capable of sensing and monitoring voltages of the integrated circuit 520 and performing a dynamic voltage compensation process in order to maintain a desired voltage at the $N^{th}$ feature 538. This desired voltage may be based upon a predetermined acceptable range of voltages. In one embodiment, the dynamic compensation module 570 may use the voltage ($V_{ref}$ 584) at the $1^{st}$ feature 532, which is coupled to the pin 540, as a reference voltage to determine the amount of voltage drop. The dynamic compensation module 570 may monitor a voltage ($V_{monitor}$ 582) at a predetermined location of the integrated circuit 520, e.g., at the $N^{th}$ feature 538. When the dynamic compensation module 570 detects that the voltage at the $N^{th}$ feature 538 ($V_{monitor}$ 582) is below the reference voltage ($V_{ref}$ 584) by a first predetermined value, a compensation of the voltage level on the $V_{monitor}$ 582 is performed to bring the voltage level of $V_{monitor}$ 582 back up to a second predetermined value (e.g., the reference voltage ($V_{ref}$ 584)). Components of the dynamic compensation module 570 may assure that the compensation of the voltage level on $V_{monitor}$ line 582 is made within a predetermined time delay (e.g., see $T_{delay}$ of FIG. 4). A more detailed depiction of the dynamic compensation module 570 is provided in FIG. 6 and accompanying description below.

Moreover, in one embodiment, the dynamic compensation module 570 may be formed such that it is part of the same die ($1^{st}$ die 510) on which the integrated circuit 520 is formed. Further, in one embodiment, the integrated circuit 520 and said dynamic voltage compensation circuit are formed a single device package or chip. This allows for producing a device 500 of a smaller footprint and of lower height.

Figure 6:
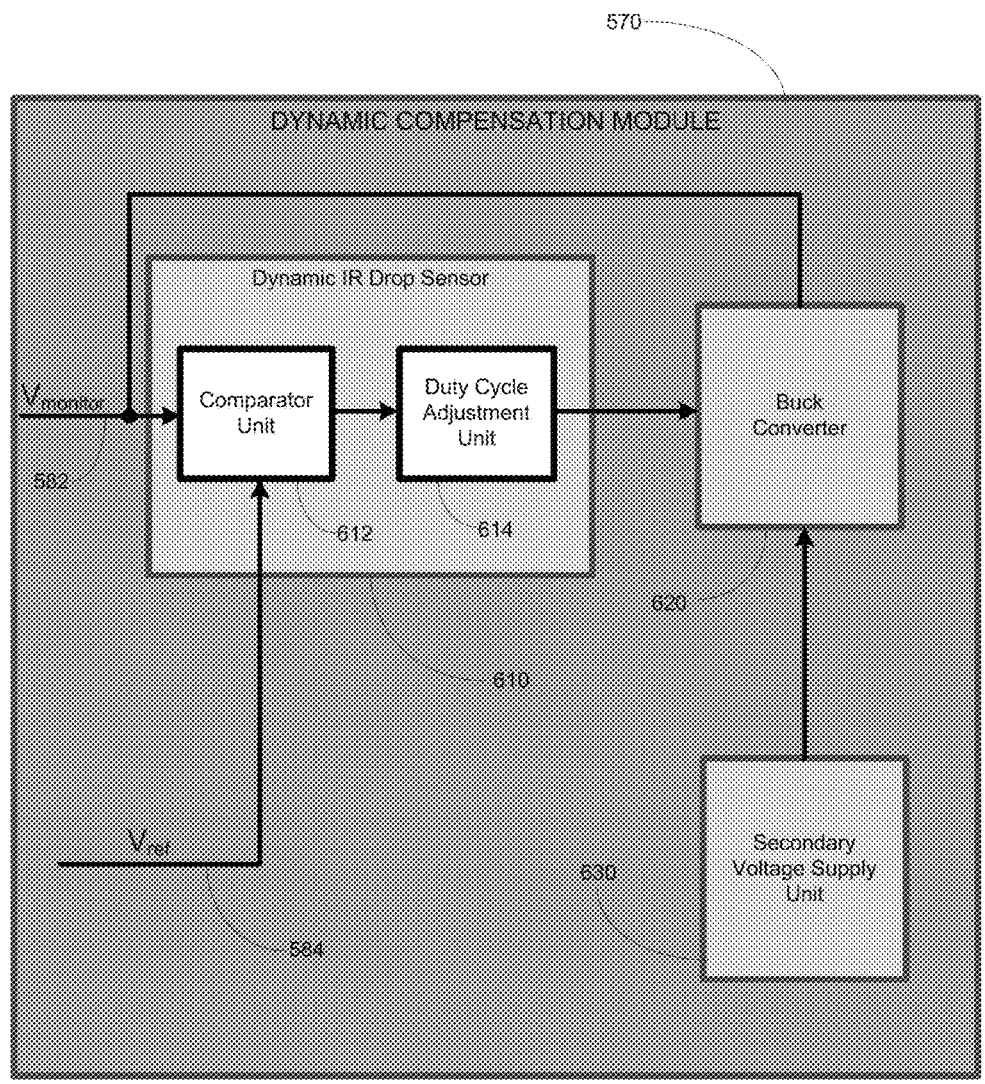
FIG. 6 illustrates a stylized block diagram depiction of the dynamic compensation module of FIG. 5, in accordance with embodiments herein.

Turning now to FIG. 6, a stylized block diagram depiction of the dynamic compensation module 570 of FIG. 5, in accordance with embodiments herein is illustrated. In one embodiment, the dynamic compensation module 570 comprises a dynamic IR drop sensor 610. The dynamic IR drop sensor may comprise a comparator unit 612 and a duty cycle adjustment unit 614. In one embodiment, the comparator unit 612 is a high speed comparator device. The comparator unit 612 may comprise a plurality of comparators that are capable of comparing $V_{ref}$ 584 to a $V_{monitor}$ 582 to determine whether it is higher or lower than desired. The comparators in the comparator unit 612 may be arranged in such a fashion that it provides a digital output for a "high" comparison result, or a "low" comparison result (i.e., a digital signal indicative of whether a voltage is higher or lower compared to a reference voltage). For example, $V_{ref}$ 584 and $V_{monitor}$ 582 may be provided to two comparators in a manner that the comparator unit 612 assert a "high" signal or a "low" signal based on the comparisons.

The output of the comparator unit 612 is provided to the duty cycle adjustment unit 614. A voltage adjustment by the dynamic compensation module 570 is performed when the output of the comparator unit 612 indicates that the voltage difference is not zero. Further, the duty cycle adjustment unit 614 is capable of determining the duty cycle of the voltage signal on the $V_{monitor}$ line 582. The duty cycle adjustment unit 614 adjusts the duty cycle in response to a digital count based on the output of the comparator unit 612, as described in further details below.

The output from the duty cycle adjustment unit 614 is provided to a buck converter 620 (e.g., a micro-buck converter). The buck converter 620 is capable of adjusting the voltage level of the $V_{monitor}$ line 582 to compensate for the IR drop experienced by the $N^{th}$ feature 538. In one embodiment, the buck converter 620 may receive power from a secondary power supply unit 630, e.g., a micro buck supply voltage unit. Upon sensing a decrease in the $V_{monitor}$ line 582 in the amount of a first predetermined level, the dynamic compensation module 570 steps up the voltage on the $V_{monitor}$ line 582 to a second predetermined level (e.g., $V_{ref}$ 584).

Figure 7:
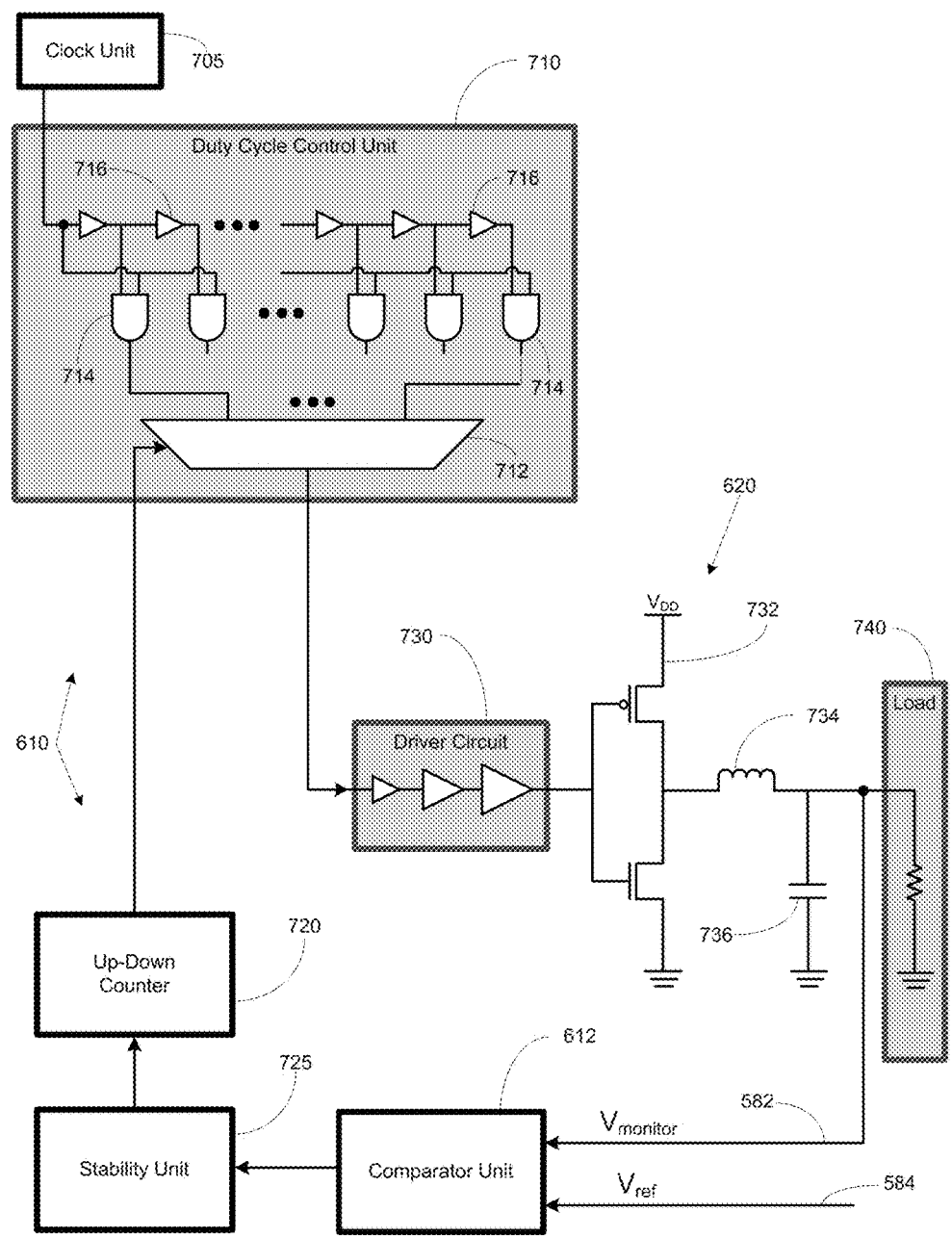
FIG. 7 illustrates a stylized depiction of a stylized circuit representation of the dynamic compensation module 570, in accordance with one embodiment herein.

Turning now to FIG. 7, a stylized depiction of a circuit representation of the dynamic compensation module 570, in accordance with one embodiment herein, is illustrated. The dynamic IR drop sensor 610 comprises a stability unit 725 that is coupled to the output of the comparator unit 612. In some embodiments, in a latching comparator, if the comparator takes more time to switch to a valid output state and a predetermined interval, a stability problem may occur. In some cases, parasitic feedback can also affect circuit stability. The stability unit 725 is capable of reducing instability caused by the operation of the comparator unit 612.

The dynamic IR drop sensor 610 may also comprise a digital counter 720. The digital counter 720 is capable of maintaining a count for the up/down (or high/low) output signals from the comparator unit 612. The dynamic IR drop sensor 610 also comprises a duty cycle control unit 710. The duty cycle control unit 710 may be driven by a clock signal from a clock unit 705. The clock signal is cycled through a plurality of buffers 716 and respective AND gates 714. The output of the AND gates 714 are provided to a multiplexer (MUX) 712 in dynamic IR drop sensor 610. The select signal for the multiplexer 712 is the output from the digital counter 720. In this manner, the need for a pulse width modulator of the prior art is avoided, i.e., by utilizing the duty cycle control unit 710 and the digital counter 720. Therefore, by using the duty cycle control unit 710 and the digital counter 720 of embodiments herein, a significant amount of space is saved and an appreciable amount of power consumption is reduced when implementing a dynamic voltage compensation apparatus of embodiments herein.

The output from the duty cycle control unit 710 (from the MUX 712) is provided to the buck converter 620. More particularly, the output from the MUX 712 is provided to a driver circuit 730 of the buck converter 620. The output from the driver circuit 730 is provided to a buffer 732, as exemplified in FIG. 7. The output from the buffer 732 is coupled to an inductor 734, whose output is coupled to a capacitor 736. The inductor 734 may be an on-chip or package-level inductor.

The load experienced by the dynamic compensation module 570, e.g., a TSV structure, is in parallel to the capacitor 736, connected to the output of the buck converter 620. The output of the buck converter 620 is fed back to the comparator unit 612. In this manner, if the difference between the reference voltage $V_{reference}$ line 584 and the $V_{monitor}$ line 582 is not zero, the output of the buck converter 620 is used to step up the voltage on the $V_{monitor}$ line 582. Therefore, the circuit 570 is used to maintain the voltage on the $N^{th}$ feature 538 within a predetermined margin of the supply voltage found on the $1^{st}$ feature 532. In this manner, the IR drop within the integrated circuit 520 is dynamically compensated for, maintaining a voltage level within a predetermined margin throughout the integrated circuit 520.

Figure 8:
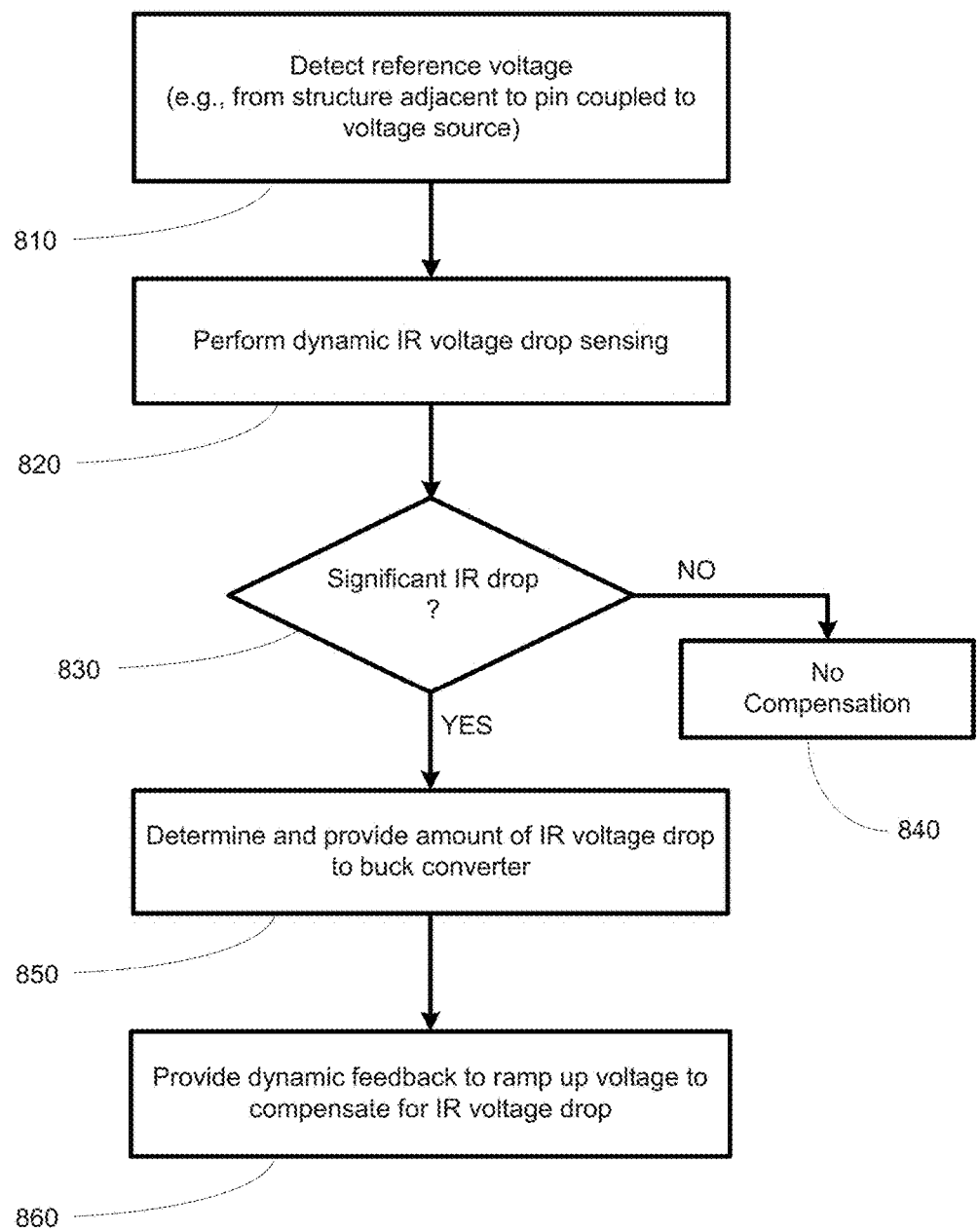
FIG. 8 illustrates a stylized flowchart representation of a method for performing a dynamic voltage compensation, in accordance with embodiments herein.

Turning now to FIG. 8, a stylized flowchart representation of a method for performing a dynamic voltage compensation, in accordance with embodiments herein, is illustrated. The dynamic voltage compensation unit 570 receives a reference voltage (at 810). The reference voltage may be a supply voltage delivered to a power pin of an integrated circuit package, which may be coupled to a feature on a BEOL layer. A dynamic IR voltage drop sensing step may be performed (at 820). One or more locations within the integrated circuit may be monitored. For example, a structure on the M1 layer in a BEOL stack may be dynamically monitored to detect a voltage drop as compared to the reference voltage.

A determination may be made as to whether the dynamically sensed IR voltage drop is above a predetermined threshold (at 830). A comparator function may be performed to make this determination. For example, in a time period of an increase loading experienced by the integrated circuit, an increased IR drop may be detected. If the IR voltage drop is not above the predetermined threshold, then no voltage compensation is performed (at 840). However, if IR voltage drop is above the predetermined threshold, the amount of IR voltage drop is determined and this information is provided to a buck converter (at 850). A duty cycle controller may be used to control the timing of the step up of the voltage being monitored. Further, a secondary voltage source may be used to provide the power required to perform a voltage step in order to bring the monitored voltage up to a predetermined margin (e.g., the reference voltage). Based on the IR voltage drop amount, a dynamic feedback voltage step up may be performed (at 860). In this manner, a dynamic voltage compensation for one or more selected portion of an integrated circuit may be performed. The voltage compensation provided herein may be performed in 2D and 3D devices, and further reduction of TSV droop may be realized.

Figure 9:
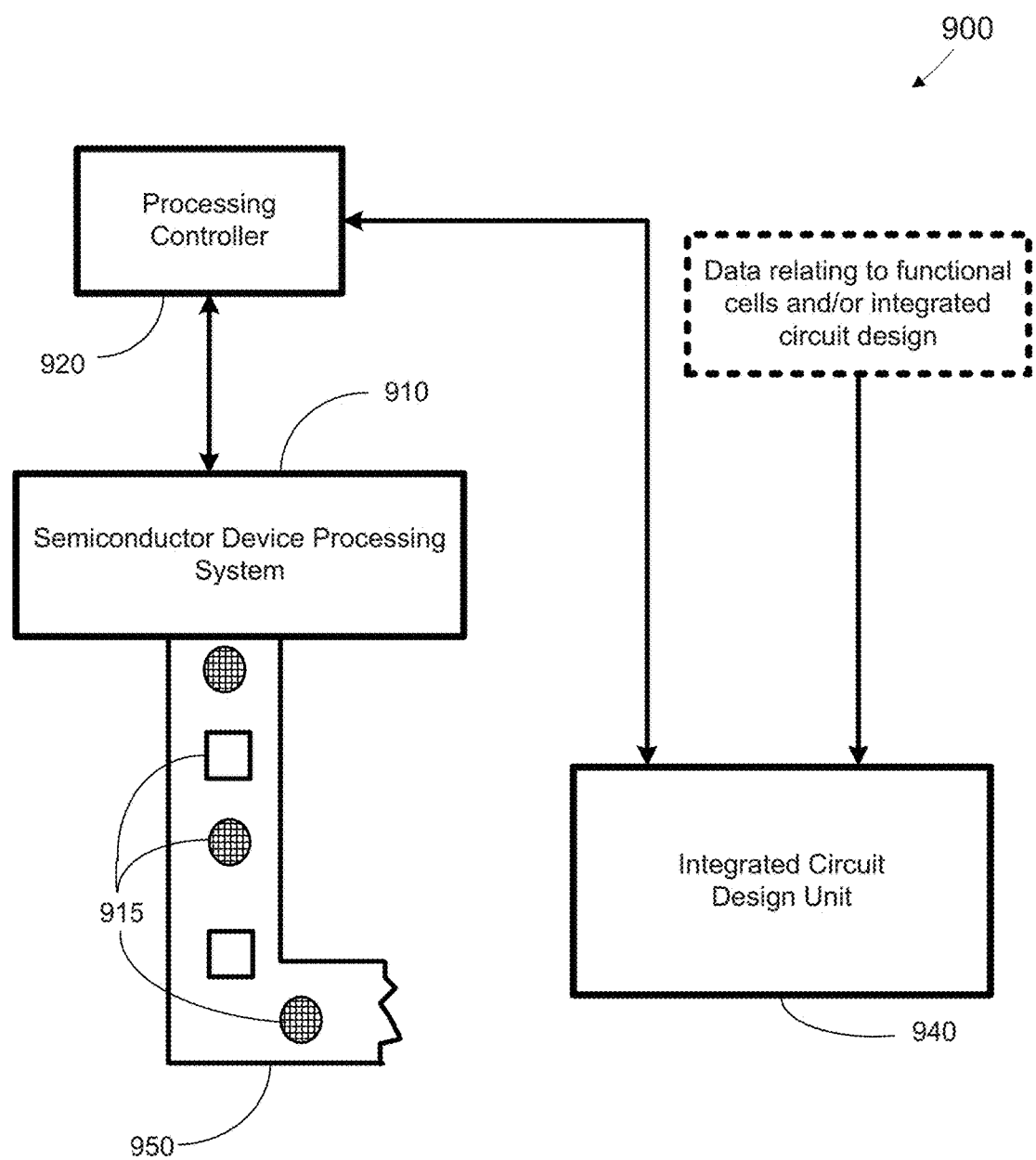
FIG. 9 illustrates a semiconductor device processing system for manufacturing an integrated circuit comprising a dynamic compensation module, in accordance with some embodiments herein.

Turning now to FIG. 9, a stylized depiction of a system for manufacturing an integrated circuit comprising a dynamic compensation module, in accordance with embodiments herein, is illustrated. The system 900 of FIG. 9 may comprise a semiconductor device processing system 910 and a design unit 940. The semiconductor device processing system 910 may manufacture integrated circuit devices based upon one or more designs provided by the design unit 940.

The semiconductor device processing system 910 may comprise various processing stations, such as etch process stations, photolithography process stations, CMP process stations, etc. One or more of the processing steps performed by the processing system 910 may be controlled by the processing controller 920. The processing controller 920 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 910 may produce integrated circuits on a medium, such as silicon wafers. The production of integrated circuits by the device processing system 910 may be based upon the circuit designs provided by the integrated circuits design unit 940. The integrated circuit may comprise a dynamic compensation circuit described above. Further, the integrated circuit may be manufactured such that the various circuitry for performing the core functions of the integrated circuit are also produced on the same die.

The processing system 910 may provide processed integrated circuits/devices 915 on a transport mechanism 950, such as a conveyor system. In some embodiments, the conveyor system may be sophisticated clean room transport systems that are capable of transporting semiconductor wafers. In one embodiment, the semiconductor device processing system 910 may comprise a plurality of processing steps, e.g., the 1$^{st}$ process step, the 2$^{nd}$ process step, etc., as described above.

In some embodiments, the items labeled "915" may represent individual wafers, and in other embodiments, the items 915 may represent a group of semiconductor wafers, e.g., a "lot" of semiconductor wafers. The integrated circuit or device 915 may be a transistor, a capacitor, a resistor, a memory cell, a processor, and/or the like. In one embodiment, the device 915 is a transistor and the dielectric layer is a gate insulation layer for the transistor.

The integrated circuit design unit 940 of the system 900 is capable of providing a circuit design that may be manufactured by the semiconductor processing system 910. The design unit 940 may receive data relating to the functional cells to utilize, as well as the design specifications for the integrated circuits to be designed.

In other embodiments, the integrated circuit design unit 940 may perform an automated determination of IR voltage drops on one or more locations of the integrated circuit. These voltage drops may be used to perform a compensation for the IR voltage drop. For example, once a designer or a user of the integrated circuit design unit 940 generates a design using a graphical user interface to communicate with the integrated circuit design unit 940, the unit 940 may perform automated modification of the design. In other embodiments, the integrated circuit design unit 940 may be capable of automatically generating one or more offset features for metal formation in cells, or retrieve data regarding the offset parameters from a library.

The system 900 may be capable of performing analysis and manufacturing of various products involving various technologies. For example, the system 900 may design and production data for manufacturing devices of CMOS technology, Flash technology, BiCMOS technology, power devices, memory devices (e.g., DRAM devices), NAND memory devices, and/or various other semiconductor technologies.

Although in some examples, circuits herein were described in terms of NMOS devices for consistency, those skilled in the art would appreciate that concepts described herein may also apply to PMOS devices and remain within the scope of embodiments herein.

The system 900 may be capable of manufacturing and testing various products that include transistors with active and inactive gates involving various technologies. For example, the system 900 may provide for manufacturing and testing products relating to CMOS technology, Flash technology, BiCMOS technology, power devices, memory devices (e.g., DRAM devices), NAND memory devices, processors, and/or various other semiconductor technologies.

The methods described above may be governed by instructions that are stored in a non-transitory computer readable storage medium and that are executed by, e.g., a processor in a computing device. Each of the operations described herein (e.g., FIGS. 7-8) may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. A method, comprising:
    detecting a first voltage on a first layer of an integrated circuit;
    monitoring a second voltage on a second layer of said integrated circuit;
    determining, by a comparator circuit, whether said second voltage falls below said first voltage by a predetermined margin;
    providing, by an up-down digital counter, a count output signal based at least in part on a number of down output signals provided by said comparator circuit; and
    performing a feedback adjustment of said second voltage in response to a determination that said second voltage fell below said first voltage by said predetermined margin; wherein said feedback adjustment comprises performing, by a buck converter, a step up of said second voltage.

2. The method of claim 1, wherein determining whether said second voltage falls below said first voltage by a predetermined margin comprises providing said first voltage and said second voltage to a comparator for comparing said first and second voltages.

3. The method of claim 2, further comprising performing a digital count of a plurality of output from said comparator for performing a duty cycle control of said second voltage.

4. The method of claim 1, wherein monitoring a second voltage on a second layer of said integrated circuit further comprises monitoring an amount of current-resistance (IR)

voltage drop of said second voltage signal based on an increase of a load experienced by circuitry in said second layer of said integrated circuit.

5. The method of claim 1, wherein monitoring a second voltage on a second layer of said integrated circuit comprises monitoring an IR voltage drop at a through silicon via (TSV).

6. The method of claim 1, wherein performing a feedback adjustment of said second voltage comprises using a secondary voltage supply for compensating said second voltage.

7. The method of claim 1, wherein detecting a first voltage on said first layer of the integrated circuit comprises detecting a reference voltage at an input pin of said integrated circuit.

8. The method of claim 1, wherein performing said feedback adjustment of said second voltage comprises increasing the value of said second voltage proportionally to an IR loss of said integrated circuit.

9. An apparatus, comprising:
an integrated circuit comprising a first feature on a first layer and a second feature on a second layer; and
a voltage compensation circuit operatively coupled to said integrated circuit, said voltage compensation circuit adapted to:
receive a first voltage signal from said first feature;
monitor a second voltage signal from said second feature, wherein said second voltage signal is indicative of an current-resistance (IR) voltage drop of within said integrated circuit;
determine whether said second voltage signal is below said first voltage signal by a predetermined value; and
provide a voltage step up for increasing the voltage level of said second voltage signal in response to determining that said second voltage signal is below said first voltage signal by said predetermined value;
wherein said voltage compensation circuit comprises:
a comparator circuit capable of providing an output based upon a comparison of said first and second voltage signals;
an up-down digital counter to provide a count output signal based on a number of up output signals and a number of down output signals from said output of said comparator circuit;
a duty cycle adjustment unit capable of providing a duty cycle of said voltage step up based on said count output signal; and
a buck converter adapted to provide said voltage step up based on said duty cycle from said duty cycle adjustment unit, said voltage step up being based on a signal from a second voltage source.

10. The apparatus of claim 9, wherein said integrated circuit comprises of at least one back-end-of-line (BEOL) layer between said first layer and said second layer.

11. The apparatus of claim 9, further comprising a pin operatively coupled to said first feature, wherein said pin being coupled to a first voltage supply.

12. The apparatus of claim 9, wherein said integrated circuit comprises a third feature operatively coupled to said second feature, wherein said third features is surrounded by a semiconductor layer.

13. The apparatus of claim 12, wherein said third feature is one of a through silicon via (TSV) operatively coupled to a load, or a transistor operatively coupled to said load.

14. The apparatus of claim 9, wherein said voltage compensation circuit is capable of dynamically adjusting said second voltage level based upon at least one of said IR drop or a change in the loading value of said load.

15. The apparatus of claim 9, wherein said duty cycle adjustment unit is capable for providing said duty cycle based on a digital clock.

16. The apparatus of claim 9, wherein:
said duty cycle adjustment unit comprises:
a plurality of buffer-NAND gate pairs for propagating a digital clock signal;
a multiplexer adapted to receive a plurality of output signals from said plurality of buffer-NAND gate pairs, wherein the select input signal capable of selecting one of said plurality of output signals from said buffer-NAND gates is based on said output from said count output signal;
and
said buck converter comprises:
a driver circuit for driving said output from said multiplexer;
a buffer for buffering an output from said driver circuit;
an inductor coupled to an output of said buffer; and
a capacitor coupled to said inductor.

17. A system, comprising:
a design unit adapted to:
receive a design for an integrated circuit device, wherein said design comprises circuit layout comprising:
an integrated circuit comprising a first feature on a first layer and a second feature on a second layer; and
a dynamic voltage compensation circuit operatively coupled to said integrated circuit, said voltage compensation circuit being adapted to:
receive a first voltage signal from the first feature;
monitor a second voltage signal from said second feature, wherein said second voltage signal is indicative of an current-resistance (IR) voltage drop of within said integrated circuit;
determine whether said second voltage signal is below said first voltage signal by a predetermined value; and
provide a voltage step up for increasing the voltage level of said second voltage signal in response to determining that said second voltage signal is below said first voltage signal by said predetermined value;
wherein said voltage compensation circuit comprises:
a comparator circuit capable of providing an output based upon a comparison of said first and second voltage signals;
an up-down digital counter to provide a count output signal based on a number of up output signals and a number of down output signals from said output of said comparator circuit;
a duty cycle adjustment unit capable of providing a duty cycle of said voltage step up based on said count output signal; and
a buck converter adapted to provide said voltage step up based on said duty cycle from said duty cycle adjustment unit, said voltage step up being based on a signal from a second voltage source
a semiconductor device processing system for fabricating an integrated circuit device based upon said circuit layout; and
a processing controller operatively coupled to said semiconductor device processing system, said processing controller configured to control an operation of said semiconductor device processing system.

18. The system of claim 17, wherein said integrated circuit and said dynamic voltage compensation circuit are formed on a single die and in a single device package.

* * * * *